Sept. 29, 1970 N. E. COLLINS ET AL 3,531,735

SEMICONDUCTOR LASER HAVING GROOVES TO PREVENT RADIATION TRANSVERSE TO THE OPTICAL AXIS

Filed June 28, 1966

INVENTORS:
NEIL E. COLLINS,
ELWYN W. KERBER,
JAMES M. SMITH,

BY Robert J. Mooney
THEIR ATTORNEY.

United States Patent Office 3,531,735
Patented Sept. 29, 1970

3,531,735

SEMICONDUCTOR LASER HAVING GROOVES TO PREVENT RADIATION TRANSVERSE TO THE OPTICAL AXIS

Neil Eugene Collins, Liverpool, Elwyn W. Kerber, Phoenix, and James M. Smith, Liverpool, N.Y., assignors to General Electric Company, a corporation of New York Filed June 28, 1966, Ser. No. 561,184
Int. Cl. H01s 3/18
U.S. Cl. 331—94.5 4 Claims

ABSTRACT OF THE DISCLOSURE

This invention relates to a high power PN junction semiconductor device with spurious transverse radiation minimized by dividing the junction into a plurality of increments, each having a transverse width which is substantially smaller than the longitudinal spacing of the Fabry-Perot reflection faces. The junction increments are defined by gaps or slots in the semiconductor material having non-parallel side walls and extending between the Fabry-Perot faces and deep enough to intersect the plane of the junction.

The present invention relates to improvements in semiconductor radiation-emitting PN or PIN junction diodes, and more particularly to such devices intended to have large power outputs such as, in the case of CW operation, 10 watts optical power, and useful for example in stimulated emission of coherent radiation.

Semiconductor devices suitable for the stimulated emission of coherent radiation, and including impurity impregnated or doped and P-type regions separated by a very thin intermediate I or PN junction region, are known. Devices of this general type are described in U.S. Pat. 3,245,002, which is assigned to the assignee of the present invention, and the specification of which is incorporated herein by reference. Briefly, such devices comprise a body of direct transistion semiconductor material, as for example gallium arsenide or gallium arsenide phosphide, having a degenerately impurity-impregnated P-type region and a degenerately impurity-impregnated N-type region separated by a thin PN or I junction region. A further discussion of direct transition semiconductor material per se may be found in the article by H. Erenreich in the Journal of Applied Physics, volume 32, p. 2155 (1961). The junction region of semiconductor devices to which the present invention relates extends to and terminates at two parallel exterior faces of the semiconductor body. The parallel exterior faces define a Fabray-Perot resonant cavity of which the junction region is a part, and within which standing waves are generated having a desired frequency determined by the composition of the semiconductor material and the spacing of the two parallel exterior faces. Energy is supplied to the device by current through the junction region, and, if desired, also by incidence on the junction region of radiation from an external source, and the resultant emission of radiation from the device occurs along the plane of the junction region at at least one edge thereof. In certain types of such devices which have been constructed, the spacing of these two parallel exterior Fabry-Perot faces is, for example, of the order of 15 to 30 mils.

One of the difficulties in operating such a device at high power levels of the order of 10 watts optical power is that the area of the junction region must be comparatively quite large so as to maintain the density of current through the junction region below a limit at which the semiconductor material is deleteriously affected by the resultant heat generated within the semiconductor material itself. However, any increase in the junction area by an increase in the dimension or coordinate corresponding to the spacing of the two parallel exterior faces forming the Fabray-Perot cavity is limited by the effect of excessive absorption by the semiconductor material itself of wave energy within the cavity traveling along the resulting longer path length between the Fabry-Perot faces. Consequently, too large a spacing of the parallel exterior faces excessively increases internal losses and actually reduces radiation output power. Moreover, any loss of output radiation due to any aberrations of the planar junction region in a direction normal to the direction of propagation of the standing waves in the cavity is likely to be greatly increased as the spacing of the parallel Fabry-Perot faces is increased.

For the above reasons, attempts heretofore to improve power output of such devices have involved increasing junction area by increasing the other dimension or coordinate affecting it, namely that dimension or coordinate which extends parallel to the Fabry-Perot faces. But any substantial increase in the latter dimension such as to provide a significant increase in power output of such devices has unfortunately been found to produce radiation and standing waves in the junction region directed not in the desired direction, i.e. normal to the Fabry-Perot faces, but in the transverse direction, i.e. parallel to the Fabry-Perot faces. The occurrence of such transverse radiation of course consumes energy intended for radiation in the desired direction normal to the Fabry-Perot faces, and hence is highly objectionable and greatly increases the difficulty of achieving high output power levels.

Accordingly, a principal object of the present invention is to provide an improved high power semiconductor diode radiation emitter of the foregoing character having a junction region of extended dimension or coordinate in the direction parallel to its Fabry-Perot faces, yet in which losses due to such undesired radiation in such dimension or coordinate are minimized.

Another object is to provide such a semiconductor PN junction radiation-emitting device which is capable of sustained CW operation at higher power levels than heretofore attainable.

Another object is to provide such a device having a minimum size emission source for a given power output, and which therefore is compatible with other optical elements of reduced size and cost.

Another object is to provide such a device in which each part of the emitted radiation is exactly parallel and coplanar with the remaining parts.

These and other objects of the invention will be apparent from the following description and the accompanying drawings wherein.

Figure 1:
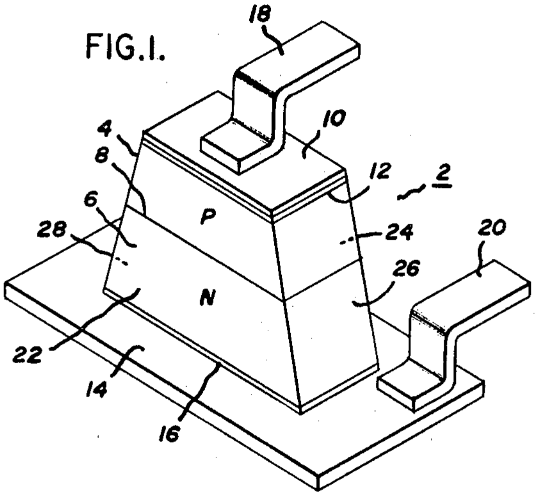
FIG. 1 is a perspective view of a semiconductor device of the general type to which the present invention relates.

Referring to the drawing, FIG. 1 shows an exemplary semiconductor radiation-emitting diode of the type to which the present invention relates. The structure of FIG. 1 comprises a crystal 2 of semiconductor material having a degenerately impurity-impregnated or doped P-type region 4 and a degenerately impurity-impregnated or doped N-type region 6, these regions being spaced by a laminar junction region 8 such as a PN junction or thin I region. Non-rectifying contact is made between the P-type region 4 and a first electrode 10 by means of an acceptor type or electrically neutral solder layer 12, and a non-rectifying connection is made between N-type region 6 and a second electrode 14 by means of a donor type or electrically neutral layer 16. Electrode connectors 18 and 20 are connected to electrodes 10 and 14 respectively, for example by welding, brazing or the like.

Spaced exterior Fabry-Perot faces 22 and 24 are exactly parallel to each other, perpendicular to one dimension or coordinate of junction region 8, and parallel to the other dimension or coordinate junction region 8. Junction region 8 is illustrated in FIG. 1 as of flat planar configuration, with both its first dimension or coordinate perpendicular to faces 22 and 24, and its second dimension or coordinate parallel to faces 22 and 24, being rectilinear. However, it will be appreciated that the intersection of junction region 8 with faces 22 and 24 could be annular, parti annular, arcuate, or otherwise different than a straight line, and hence the second coordinate or dimension of junction region 8 parallel to faces 22 and 24 need not be a straight line. The other side faces 26 and 28 of the semiconductor body are nonparallel and may desirably be roughened to inhibit reflection between them.

In accordance with our invention, gaps or discontinuities are formed in the junction region 8 at intervals spaced in the second coordinate or dimension (i.e. parallel to the Fabry-Perot faces) of the junction region 8. Such gaps are so spaced and dimensioned as to effectively divide the large area junction region 8 into a plurality of incremental junction regions, all exactly continuous and coplanar in the direction of the second dimension or coordinate, and all, of course, have exactly parallel and equal dimensions perpendicular to faces 22 and 24. Each incremental junction extends from one Fabry-Perot face to the other, and hence has the length, or dimension normal to and determined by the spacing of the Fabry-Perot faces 22 and 24, sufficient to produce the desired degree of internal amplification and desired emission of radiation normal to the Fabry-Perot faces when suitable excitation is applied to the device. However, the size of each incremental junction in the second dimension or coordinate, as measured from gap to gap in a direction parallel to the Fabry-Perot faces, is made too small to allow any but a negligible amount of amplification of radiation propagating within the semiconductor body in the direction of such second dimension or coordinate. Therefore, such a device constructed according to our invention has the extended junction area needed to enable operation at high power levels yet is substantially free of emission in any but the desired direction normal to the Fabry-Perot faces 22 and 24.

Figure 2:
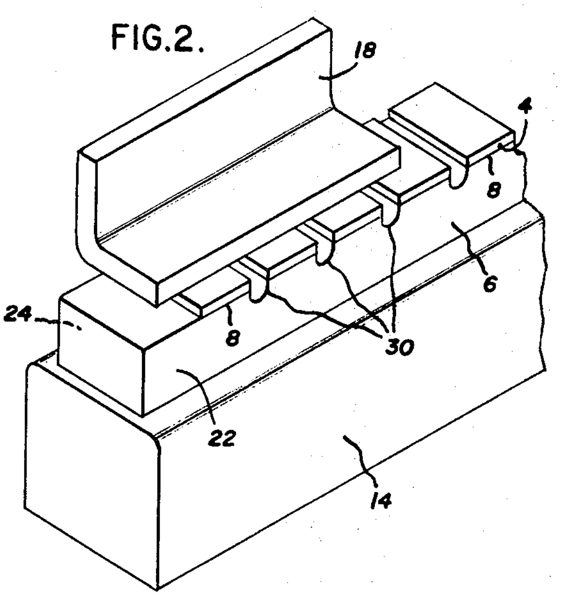
FIG. 2 is a perspective view of one form of semiconductor device constructed according to the present invention.
Figure 3:
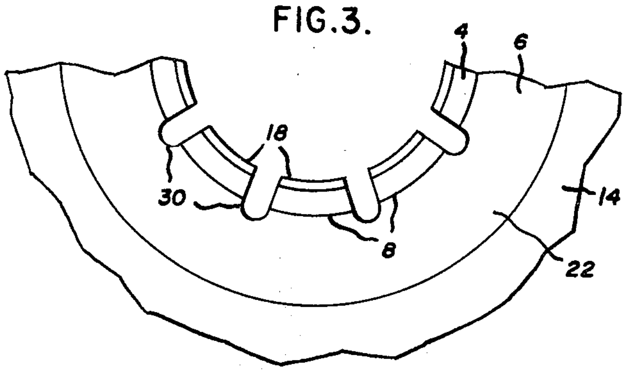
FIG. 3 is a sectional view of another form of semiconductor device constructed according to the present invention.

FIG. 3 shows an embodiment similar to FIG. 2 except that the second dimension or coordinate of junction 8 is parti annular.

Figure 4:
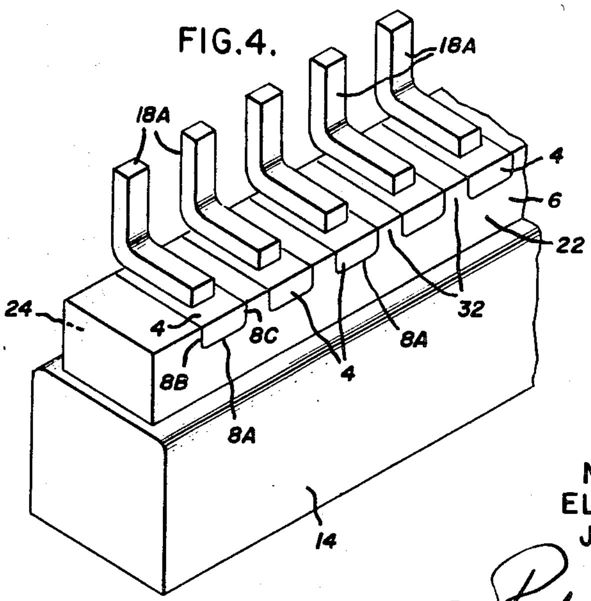
FIG. 4 is a perspective view of another form of semiconductor device constructed according to the present invention.

Such gaps or discontinuities may be conveniently formed in several ways. For example, they may be formed by removal of material, as by selective etching, abrasion, sawing, or the like, to produce a plurality of notches or crenellations as shown at 30 in FIG. 2. Alternatively, such gaps may be produced without removal of material, as shown at 32 in FIG. 4, by forming the junction region initially as a plurality of spaced parallel coplanar increments 8A, having marginal portions 8B and 8C which extend to the top surface. Junction portions 8A and 8B as shown in FIG. 4 may be formed, for example, by controlled diffusion through selected apertures in a surface masking layer in accordance with techniques known in the semiconductor art.

The gaps separate the junction region into a plruality of increments, and in such devices which have been built using monocrystalline gallium arsenide as the semiconductor material and generally similar in shape to the embodiment of FIG. 2, for example , such junction increments have had a width parallel to faces 22 and 24 of about 5 to 8 mils and a length perpendicular to faces 22 and 24 of about 20 mils. When such gaps are formed by notches such as shown at 30, the notches should be deep enough to extend down through the locus of the junction region. The notches may have various cross-sectional shapes, but preferably, to minimize reflection of radiation within the semiconductor body at the side walls of the notches 30 and in the transverse direction corresponding to the second dimension or coordinate of the junction region, the notch side walls should be nonparallel, and desirably the notch side walls may be deliberately roughened to further reduce reflections. The widths of such notches may also vary, though desirably the notches should be as narrow as it is convent to provide so as to maximize the area of the total remaining junction region available in a structure of given overall size, thereby maximizing output power capability. Also, the narrower is each notch 30, the closer spaced are the junction increments separted thereby, and hence the smaller is the overall size of the emission source for a given power output. Such devices have been built with notches 30 as narrow, for example, as .0002 inch. Gaps between the incremental junctions in the structure of FIG. 3 having corresponding dimensions would, of course, have similar advantages.

Thus there has been shown and described an improved semiconductor stimulated emission device capable of high output power without objectionable loss of power to undesired transverse radiation. The structures shown and claimed are relatively easy to form, and answer the urgent need for a relative efficient, small size stimulated emission semiconductor diode of high power and capable of continuous wave operation without deleterious effect on the semiconductor material due to excessive heating.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. In a semiconductor diode for stimulated emission of radiation, a semiconductor body having a one conductivity type region and an opposite conductivity type region separated by a flat laminar junction region lying in one common plane, a pair of parallel exterior Fabry-Perot faces on said semiconductor body, said junction region extending in a first coordinate normal to said Fabry-Perot faces and in a second coordinate parallel to said faces, a first electrode contacting the exterior face of the one conductivity type region, a second electrode contacting the exterior face of said opposite conductivity type region, means dividing the said semiconductor body at the area of said junction region into a plurality of cooperative increments joined by said first electrode and spaced in said second coordinate with the junction increment contained therein lying in said common plane, each said increment having a dimension in said second coordnate substantially less than the spacing of said parallel faces, said means consisting of notches having nonparallel side walls, and said notches extending longitudinally between said Fabry-Perot faces and being spaced in said second coordinate, and each of said notches extending in depth from said one conductivity type region through said junction region into but not through said opposite conductivity type region.

2. A semiconductor diode as defined in claim 1 wherein said side walls are roughened to reduce transverse radiation.

3. A semiconductor device for stimulated emission of radiation comprising a body of semiconductor material having a degenerately impurity-impregnated N region and a degenerately impurity-impregnated P region separated by a flat laminar junction region lying in one common plane, a first electrode contacting the exterior face of said N region, a second electrode contacting the exterior face of said P region, a pair of parallel exterior Fabry-Perot faces on said semiconductor body having a spacing of about 15 to 30 mils, said junction region extending in a first coordinate normal to said Fabry-Perot faces and in a second coordinate parallel to said Fabry-Perot faces, one of said degenerately impregnated regions being crenellated by a plurality of grooves having non-parallel side walls spaced in said second coordinate and extending longitudinally in said first coordinate from one Fabry-Perot face to the other Fabry-Perot face, each of said grooves extending in depth through the locus of said junction region so as to divide said junction region into a plurality of cooperative parallel increments joined by said first electrode spaced in said second coordinate with the junction increments contained therein lying in said common plane, each said increment having a dimension in said second coordinate of about 5 to 8 mils.

4. In a semiconductor diode for stimulated emission of radiation, a semiconductor body having a one conductivity type region and an opposite conductivity type region separated by a flat laminar junction region lying in one common plane, a pair of parallel exterior Fabry-Perot faces on said semiconductor body, said junction region extending in a first coordinate normal to said Fabry-Perot faces and in a second coordinate parallel to said faces, a first electrode contacting the exterior face of the one conductivity type region, a second electrode contacting the exterior face of said opposite conductivity type region, means dividing said semiconductor body at the area of said junction region into a plurality of cooperative increments joined by said first electrode spaced in said second coordinate with the junction increments contacted therein lying in said common plane, each said increment having a dimension in said second coordinate of about 5 to 8 mils, said means extending longitudinally a distance of about 20 mils between said Fabry-Perot faces and being spaced in said second coordinate, and said means comprising a plurality of notches extending in depth from said one conductivity type region through said junction region into but not through said opposite conductivity type region and having a width of about .2 mil.

References Cited

UNITED STATES PATENTS

| | | | |
|---|---|---|---|
| 3,248,670 | 4/1966 | Dill et al. | 331—94.5 |
| 3,341,937 | 9/1967 | Dill | 331—94.5 X |
| 3,257,626 | 6/1966 | Marinace et al. | 331—94.5 |
| 3,349,475 | 10/1967 | Marinace | 331—94.5 |
| 3,359,508 | 12/1967 | Hall | 331—94.5 |

RONALD L. WIBERT, Primary Examiner

E. BAUER, Assistant Examiner

U.S. Cl. X.R.

317—234